(12) United States Patent
Schoonenberg et al.

(10) Patent No.: US 10,877,073 B2
(45) Date of Patent: Dec. 29, 2020

(54) ROGOWSKI COIL

(71) Applicant: Eaton Intelligent Power Limited, Dublin (IE)

(72) Inventors: Gerard Cornelis Schoonenberg, Hengelo (NL); Elisabeth Johanna Maria Morskieft, Hengelo (NL); Wilhelmus Hubertus Maria van den Bogaard, Enschede (NL)

(73) Assignee: EATON INTELLIGENT POWER LIMITED, Dublin (IE)

( * ) Notice: Subject to any disclaimer, the term of this patent is extended or adjusted under 35 U.S.C. 154(b) by 232 days.

(21) Appl. No.: 16/223,140

(22) Filed: Dec. 18, 2018

(65) Prior Publication Data

US 2019/0187185 A1   Jun. 20, 2019

(30) Foreign Application Priority Data

Dec. 20, 2017 (GB) .................................. 1721357.0

(51) Int. Cl.
| | | |
|---|---|---|
| *H01F 5/00* | (2006.01) | |
| *G01R 15/18* | (2006.01) | |
| *H01F 27/28* | (2006.01) | |
| *H01F 17/00* | (2006.01) | |
| *H05K 1/16* | (2006.01) | |

(52) U.S. Cl.
CPC ............. *G01R 15/181* (2013.01); *H01F 5/00* (2013.01); *H01F 5/003* (2013.01); *H01F 17/0013* (2013.01); *H01F 27/28* (2013.01); *H05K 1/165* (2013.01); *H01F 2017/002* (2013.01)

(58) Field of Classification Search
CPC ... G01R 15/181; H01F 5/003; H01F 17/0013; H01F 2017/002; H05K 1/165
See application file for complete search history.

(56) References Cited

U.S. PATENT DOCUMENTS 6,313,623 B1 * 11/2001 Kojovic ............... G01R 15/181
                                                                                324/127
7,579,824 B2 * 8/2009 Rea ....................... G01R 15/181
                                                                                324/117 R (Continued)

FOREIGN PATENT DOCUMENTS

GB        2342783 A       4/2000

*Primary Examiner* — Tuyen T Nguyen
(74) *Attorney, Agent, or Firm* — Leydig, Voit & Mayer, Ltd.

(57) ABSTRACT

A Rogowski coil includes: a multilayer printed circuit board having a plurality of layers forming at least an outer top circuit board surface, an outer bottom circuit board surface, an inner top circuit board surface, and an inner bottom circuit board surface; a first winding formed by a plurality of tracks arranged alternately on the outer top circuit board surface and the outer bottom circuit board surface, the plurality of tracks being electrically connected by vias extending from the outer top circuit board surface to the outer bottom circuit board surface; and a second, return winding enveloped by the first winding. The multilayer printed circuit board includes a central passage opening for passage of a current conducting conductor. Axes of the first and second winding are arranged concentric around the central passage opening. The first and second winding are electrically arranged in series.

3 Claims, 2 Drawing Sheets

(56) References Cited

U.S. PATENT DOCUMENTS

2004/0178875 A1\* 9/2004 Saito .................. G01R 19/2513
 336/200
2008/0007249 A1\* 1/2008 Wilkerson ........... G01R 15/181
 324/127

\* cited by examiner

ROGOWSKI COIL

CROSS-REFERENCE TO PRIOR APPLICATION

Priority is claimed to British Patent Application No. GB1721357.0, filed on Dec. 20, 2017, the entire disclosure of which is hereby incorporated by reference herein.

FIELD

The invention relates to a Rogowski coil comprising:
a multilayer printed circuit board having a plurality of layers forming at least an outer top circuit board surface, an outer bottom circuit board surface, an inner top circuit board surface and an inner bottom circuit board surface;
a first winding formed by a plurality of tracks arranged alternately on the outer top circuit board surface and the outer bottom circuit board surface, wherein the plurality of tracks are electrically connected by vias extending from the outer top circuit board surface to the outer bottom circuit board surface;
a second, return winding enveloped by the first winding; wherein the multilayer printed circuit board comprises a central passage opening for passage of a current conducting conductor, wherein the axes of the first and second winding are arranged concentric around the central passage opening, and wherein the first and second winding are electrically arranged in series.

BACKGROUND

Such a Rogowski coil is for example known from GB 2342783 or US 20040178875.

GB 2342783 discloses a Rogowski coil arranged on a three layer printed circuit board. Tracks on the outer two layers are electrically connected by vias to form a winding around a central passage opening through which a current conducting conductor extends. The tracks are arranged alternately on the two outer layers, such that a plurality of turns is provided forming the winding. These turns make the winding susceptible for the magnetic field generated by the current in the conductor.

As the winding is arranged concentric around the conductor, the winding itself is also a turn being susceptible for a disturbing magnetic field perpendicular to the layer of the printed circuit board.

In order to reduce this disturbing effect, GB 2342783 discloses to provide a counter turn enveloped by the winding on the inner layer of the printed circuit board.

US 2004 0178875 describes a Rowgowski coil arranged on a five layer printed circuit board. The two most outer layers are used to provide a first winding. The two layers between the center layer and the outer layers is used to provide a second winding in the same direction as the first winding to increase the sensitivity of the Rogowski coil. Two counter turns are provided on the center layer to reduce any disturbing effects in the first and second windings.

SUMMARY

In an embodiment, the present invention provides a Rogowski coil, comprising: a multilayer printed circuit board having a plurality of layers forming at least an outer top circuit board surface, an outer bottom circuit board surface, an inner top circuit board surface, and an inner bottom circuit board surface; a first winding comprising a plurality of tracks arranged alternately on the outer top circuit board surface and the outer bottom circuit board surface, the plurality of tracks being electrically connected by vias extending from the outer top circuit board surface to the outer bottom circuit board surface; and a second, return winding enveloped by the first winding, wherein the multilayer printed circuit board comprises a central passage opening for passage of a current conducting conductor, wherein axes of the first and second winding are arranged concentric around the central passage opening, wherein the first and second winding are electrically arranged in series, wherein the second, return winding comprises a plurality of tracks arranged alternately on the inner top circuit board surface and the inner bottom circuit board surface, the plurality of tracks being electrically connected by vias extending from the inner top circuit board surface to the inner bottom circuit board surface, and wherein the first and second winding have opposite direction of rotation around the respective axis.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
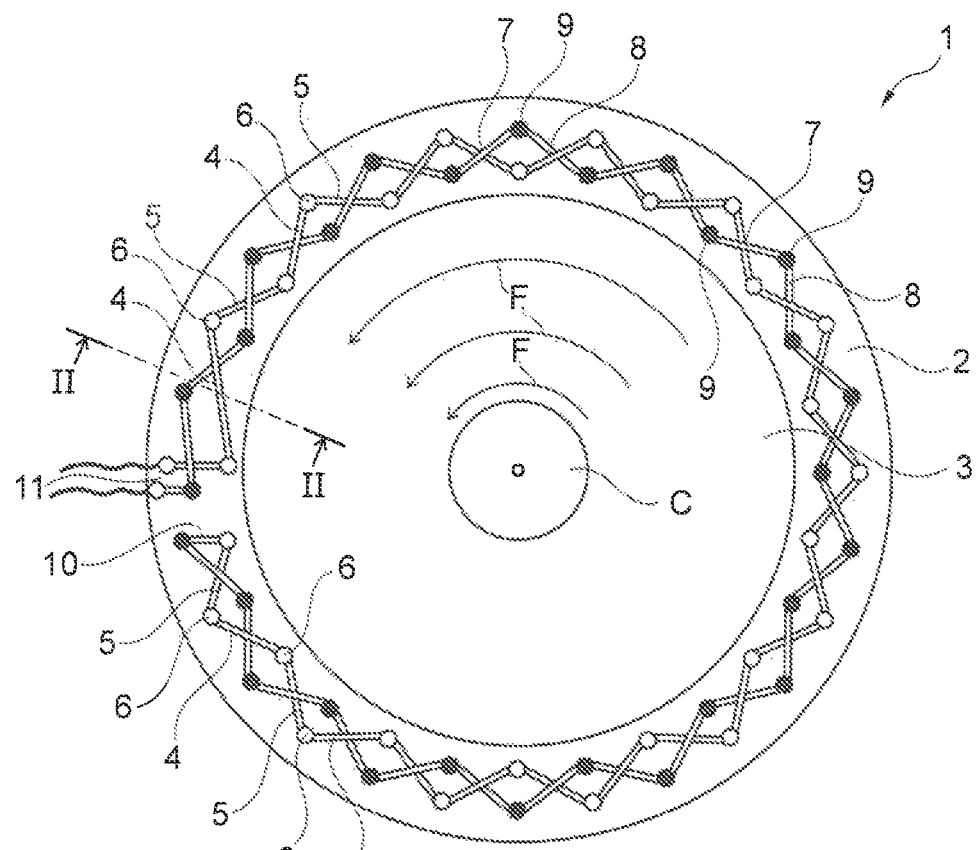
FIG. 1 shows a schematic top view of a Rogowski coil according to the invention.

An Aspect of the invention provides an alternative for the Rogowski coil constructions known in the prior art.

In an embodiment, the present invention provides a Rogowski coil wherein the second, return winding is formed by a plurality of tracks arranged alternately on the inner top circuit board surface and the inner bottom circuit board surface, wherein the plurality of tracks are electrically connected by vias extending from the inner top circuit board surface to the inner bottom circuit board surface; and wherein the first and second winding have opposite direction of rotation around the respective axis.

With the Rogowski coil according to the invention, the second, return winding increases the sensitivity of the Rogowski coil because the direction of rotation is opposite to the first winding.

Furthermore, the second, return winding also provides a reduction of disturbances due to magnetic fields perpendicular to the printed circuit boards. This is because the second, return winding also forms a turn around the central passage opening, similar to the first winding forms a turn around the central passage opening, but the second, return winding has an opposite direction (as it is the return winding) relative to the first winding.

The arrangement of the first winding and the second, return winding on only four circuit board surfaces reduces the costs, for example compared to US 2004 0178875, which requires five circuit board surfaces to have an equal sensitivity for the current measurement in the conductor extending through the central passage opening, while having a similar insensitivity for disturbing magnetic fields perpendicular to the printed circuit board.

The advantage of the second, return winding to be enveloped by the first winding, is that both windings are subjected to the same part of the magnetic field of any external sources. This further increases the accuracy of the Rogowski coil.

In a preferred embodiment of the Rogowski coil according to the invention the average line of the first winding coincides with the average line of the second winding when viewed in a direction perpendicular to the circuit board surfaces, which average line is defined as the line through the centers of gravity of each turn of a winding viewed in said direction perpendicular to the circuit board surfaces.

The average line of a winding as defined above forms the effective turn, which is susceptible for disturbing magnetic fields perpendicular to the printed circuit board. By having the average line of the first winding to coincide with the average line of the second, return winding, it is ensured that the disturbing field is fully cancelled.

In a further embodiment of the Rogowski coil according to the invention the plurality of tracks of the first and second winding are straight. Using straight tracks allows for a simple design of the circuit board surfaces and allows for relative easy calculation of the centers of gravity of each turn, such that the windings can be designed such that the average lines coincide.

It will be apparent for the person skilled in the art, that the number of windings can be increased by increasing the number of layers of the PCB. As a result, a Rogowski coil according to the invention could be created having two first windings with two second, return windings all arranged in series and enveloped by each other.

FIG. 1 shows a Rogowski coil 1 according to the invention. The coil 1 has a printed circuit board 2 with a central passage opening 3 through which a conductor C extends.

The Rogowski coil 1 has a first winding composed out of tracks 4, 5 and vias 6 and a second, return winding composed out of tracks 7, 8 and vias 9. The first winding 4, 5, 6 and the second, return winding 7, 8, 9 are arranged in series at the coupling 10, where the first winding is electrically connected to the second winding.

Figure 2:
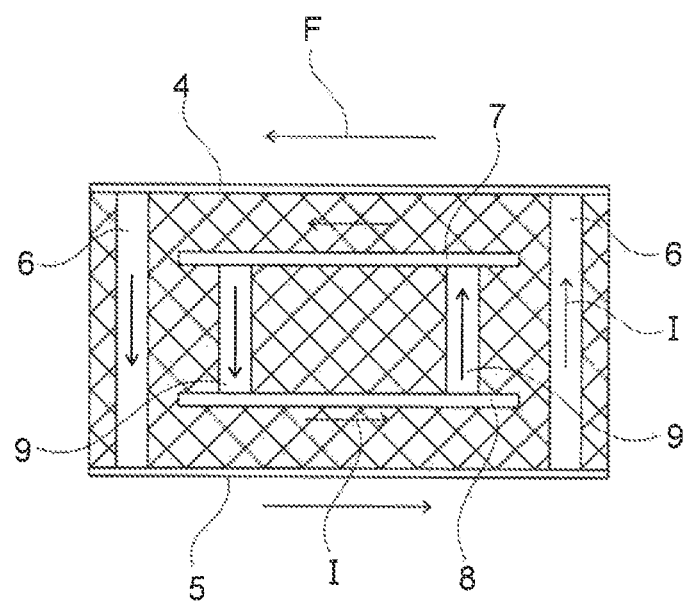
FIG. 2 shows a cross-section of the Rogowski coil of FIG. 1.

The conductor C generates an magnetic field F, which causes a current I in the first winding 4, 5, 6 and the second, return winding 7, 8, 9. (see FIG. 2). As the first and second winding have opposite direction of rotation around the respective axis and because the second winding 7, 8, 9 returns back towards the start 11 of the first winding 4, 5, 6, the current I in the first and second windings support each other, such that the sensitivity of the Rogowski coil 1 is increased.

Figure 3:
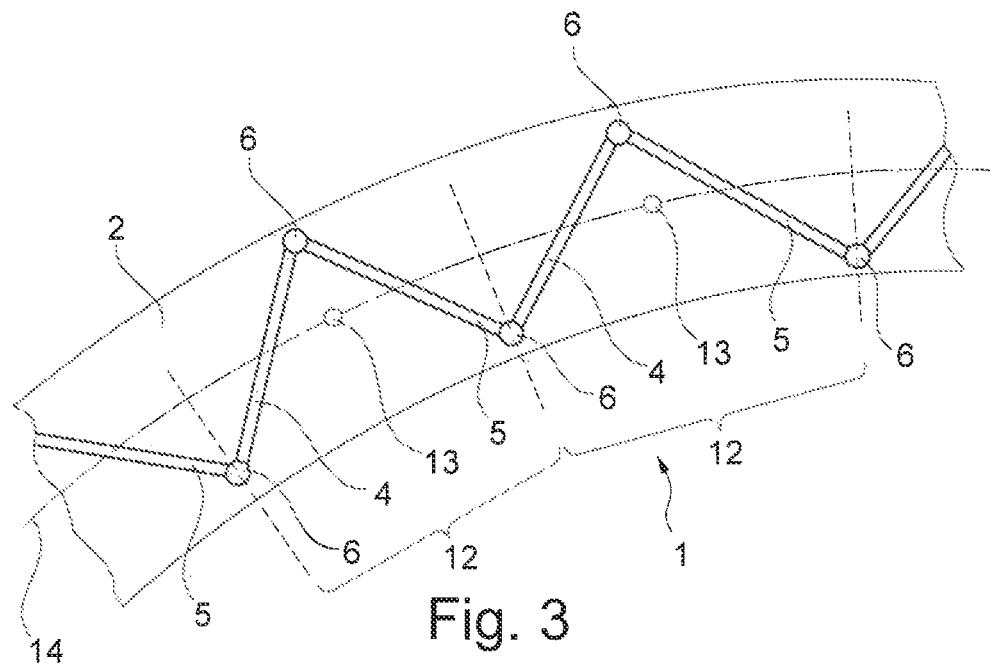
FIG. 3 shows a detail of the coil of FIG. 1.

FIG. 3 shows a detail of the Rogowski coil 1 of FIG. 1. The first winding 4, 5, 6 is depicted. A turn 12 of a first winding 4, 5, 6 is embodied by a track 4, a via 6, a track 5 and a second via 6. Viewed in the direction perpendicular to the surface of the printed circuit board 2, a winding has a center of gravity 13. As a result, the average line 14 of a winding is formed by the curve extending through all centers of gravity 13.

Figure 4:
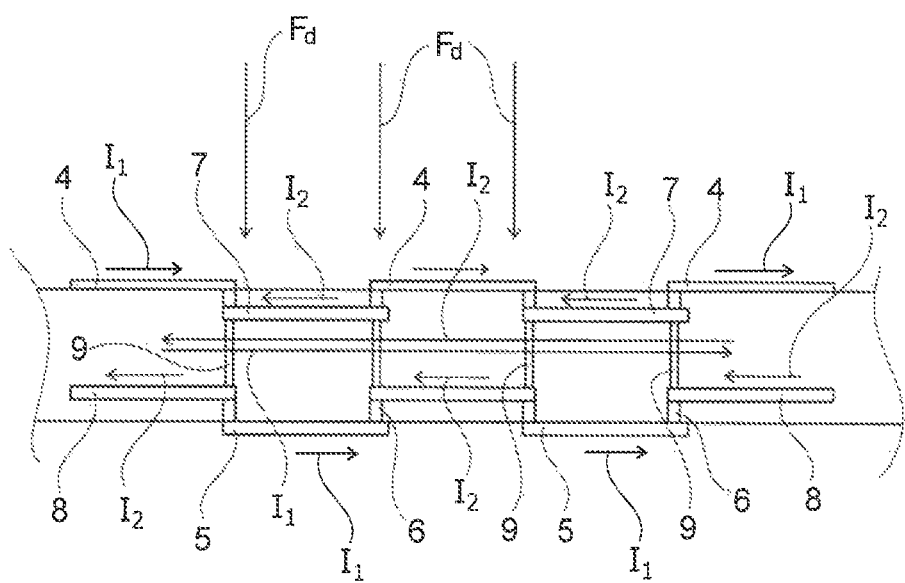
FIG. 4 shows a schematic cross-section along the average line shown in FIG. 3.

FIG. 4 shows a schematic cross-section along the average line 14. When a disturbing magnetic field $F_d$ falls perpendicular to the surface of the printed circuit board 2, a current $I_1$ will be generated in the first winding 4, 5, 6, while an opposite current $I_2$ will be generated in the second, return winding 7, 8, 9. As the average lines of the first and second windings coincide, the currents $I_1$ and $I_2$, generated by the disturbing magnetic field $F_d$, will cancel each other out, such that the Rogowski coil 1 will only measure the current in the conductor C.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A Rogowski coil, comprising:
a multilayer printed circuit board having a plurality of layers forming at least an outer top circuit board surface, an outer bottom circuit board surface, an inner top circuit board surface, and an inner bottom circuit board surface;
a first winding comprising a plurality of tracks arranged alternately on the outer top circuit board surface and the outer bottom circuit board surface, the plurality of tracks being electrically connected by vias extending from the outer top circuit board surface to the outer bottom circuit board surface; and
a second, return winding enveloped by the first winding,
wherein the multilayer printed circuit board comprises a central passage opening for passage of a current conducting conductor,
wherein axes of the first and second winding are arranged concentric around the central passage opening,
wherein the first and second winding are electrically arranged in series,
wherein the second, return winding comprises a plurality of tracks arranged alternately on the inner top circuit board surface and the inner bottom circuit board surface, the plurality of tracks being electrically connected by vias extending from the inner top circuit board surface to the inner bottom circuit board surface, and
wherein the first and second winding have opposite direction of rotation around the respective axis.

2. The Rogowski coil according to claim 1, wherein an average line of the first winding coincides with an average line of the second winding when viewed in a direction perpendicular to the circuit board surfaces, which average line comprises a line through centers of gravity of each turn of a winding viewed in the direction perpendicular to the circuit board surfaces.

3. The Rogowski coil according to claim 1, wherein the plurality of tracks of the first and second winding are straight.

* * * * *